United States Patent

Giebel

Patent Number: 5,451,861
Date of Patent: Sep. 19, 1995

[54] METHOD OF SETTING THE OUTPUT CURRENT OF A MONOLITHIC INTEGRATED PAD DRIVER

[75] Inventor: Burkhard Giebel, Denzlingen, Germany

[73] Assignee: Deutsche ITT Industries GmbH, Freiburg, Germany

[21] Appl. No.: 131,258

[22] Filed: Oct. 1, 1993

[30] Foreign Application Priority Data

Oct. 8, 1992 [DE] Germany .................. 42 33 850.6

[51] Int. Cl.$^6$ ............................................. H03K 5/12
[52] U.S. Cl. ...................................... 323/315; 327/490
[58] Field of Search .................. 323/282, 312, 315; 307/578, 579, 576, 441, 442, 443

[56] References Cited

U.S. PATENT DOCUMENTS

| | | | |
|---|---|---|---|
| 4,527,081 | 7/1985 | Stewart | 307/270 |
| 4,612,466 | 9/1986 | Stewart | 307/585 |
| 4,779,013 | 10/1988 | Tanaka | 307/443 |
| 4,829,199 | 5/1989 | Prater | 307/443 |
| 5,079,439 | 1/1992 | Wanlass | 307/246 |
| 5,319,252 | 6/1994 | Pierce et al. | 307/263 |

FOREIGN PATENT DOCUMENTS

| | | |
|---|---|---|
| 0363505 | 10/1988 | European Pat. Off. |
| 2307506 | 8/1974 | Germany |
| 4027534 | 1/1992 | Germany |
| 8903614 | 4/1989 | WIPO |

OTHER PUBLICATIONS

IBM Technical Disclosure Bulletin, Book 30, No. 9, Feb. 1988, pp. 174–176.

*Primary Examiner*—Peter S. Wong
*Assistant Examiner*—Shawn Riley
*Attorney, Agent, or Firm*—Thomas L. Peterson

[57] ABSTRACT

The invention is a method and circuit for improving the settability of the output current (i1) of at least one pad driver (D: D1, D2, ... Dn) to reduce interfering voltage dips on the supply lines. The pulselike current peaks caused by rapid charging/discharging of high load capacitances (c) are particularly avoided. To this end, the respective output transistor (t1, t1') is operated as a current-controlled element in a first range (b1) of the output voltage (OUR) and as a voltage-controlled element in a second range (b2).

18 Claims, 3 Drawing Sheets

METHOD OF SETTING THE OUTPUT CURRENT OF A MONOLITHIC INTEGRATED PAD DRIVER

BACKGROUND OF THE INVENTION

1. Field of the Invention

The present invention relates to a method of setting the output current of a monolithic integrated pad driver specifically designed for high data rates and high load capacitances.

2. Description of the Prior Art

A high current yield and high switching speed of such pad drivers are an important prerequisite for a high-speed exchange of ever increasing amounts of data between interacting data processing devices. Even within a large-scale integrated circuit, an efficient driver circuit may become necessary if a plurality of subcircuits, which represent an increased load capacitance, have to be connected to a digital signal source within the chip.

A known disadvantage of efficient pad drivers is that the value of the output current, henceforth also called "load current," is determined by the minimum current which still permits reliable data transfer under the worst possible technological and external conditions. As a result of the usual tolerances, the actual output current is thus generally much too large, e.g., by a factor of 5, and produces via the voltage-supply system voltage dips and capacitive or inductive interference signals which are difficult to control.

In addition, the transient current characteristic of prior art pad drivers is, as a rule, pulse-shaped with a distinct current maximum, so that the voltage dips in the supply system will be further increased. This mainly affects the analog signal-processing stages that may be present. During analog-to-digital or digital-to-analog conversion, interfering signal components are then produced which get into the useful-signal band through mixing effects.

According to the invention, such interference can be eliminated if the value and tolerance of the respective output current can be set and held more precisely by a suitable method and a circuit arrangement for carrying out the same.

Therefore, the method for setting the output current of pad drivers in accordance with the invention is not limited to the pad drivers of chip output terminals, but can also be applied to internal driver stages. The term "pad driver" therefore is to be understood in the broadest possible sense.

German Patent, DE-A-40 27 534, for example, discloses a CMOS pad driver in which the peak current is reduced by current-limiting means in order to eliminate interfering effects on the internal supply lines. The current limiting is provided by an additional circuit element in the manner of a junction diode in the shunt-current path of the complementary output transistors. The dimensions of the effective junction area of this diode determine the peak forward current.

It is the object of the invention as claimed to provide an improved method whereby the absolute value and the tolerance of the output current of pad drivers are more accurately settable and whereby the load-current peak, in particular, is prevented.

BRIEF SUMMARY OF THE INVENTION

To attain this object, the variation of the pad driver output current with time is determined by operating an output transistor as a current-controlled element in a first voltage range of the pad driver and as a voltage-controlled element in a second range.

The step of operating comprises the steps of driving a control electrode of the output transistor, which is coupled to a control input, in the first range by circuit of a current mirror (m) whose input is fed from a current source and whose output is formed by the output transistor. The control electrode of the output transistor in the second range is disabled, which output transistor is coupled directly to the control input. The current-mirror input is disabled with respect to the control input.

The step of operating comprises the step of changing-over from the current-controlled mode to the voltage-controlled mode of the output transistor by switching in a switching circuit using a feedback signal (f) dependent on the output voltage (OUR). The input-current path of the current mirror (m) is separated from the control input. The control electrode of the output transistor is connected to the control input. The first and second ranges are set by a switching threshold of the switching circuit.

The step of operating comprises the step of delaying the feedback signal (f) with respect to the output voltage (OUR) by circuit of a delay stage circuit which provides a delay (T) shorter than the pulse transition time of the output voltage (OUR).

The step of electronic switching comprises the step of coupling a current input of the current mirror (m) to a second transistor which is connected to the control input via a switching transistor. A delay signal from a delay stage circuit is coupled to a control electrode of the switching transistor. Signals on the control input are coupled on a common control line to the current mirror (m). At least one saturated field-effect transistor is provided in the current source.

The method further comprises the step of coupling a current source control voltage to a control electrode of at least one transistor from an auxiliary current-source (H). The method comprises the step of determining a level of the current source control voltage by the auxiliary current source (H) by means of a controlled current source.

The method comprises the steps of controlling the controlled current source by a phase-locked loop circuit and coupling to the phase lock loop circuit a signal corresponding to a charging/discharging period of a simulated load capacitance (cn) in a pad-driver-simulating network (n). A reference signal which is the delay of a clock-delay stage (tv) supplied with a standard clock signal is coupled to the phase lock loop circuit. A deviation of the charging/discharging period from a set point is determined by circuit of a phase detector (pd).

The invention also comprises an apparatus or circuit for performing the method described above.

The invention and further advantageous embodiments thereof will now be explained in greater detail with reference to the accompanying drawings, in which like elements are referenced by like numerals.

The invention and its various embodiment can now be understood in the following detailed description.

DETAILED DESCRIPTION OF THE PREFERRED EMBODIMENTS

The invention is a method and circuit for improving the settability of the output current (i1) of at least one pad driver (D: D1, D2, . . . Dn) to reduce interfering voltage dips on the supply lines. The pulselike current peaks caused by rapid charging/discharging of high load capacitances (c) are particularly avoided. To this end, the respective output transistor (t1, t1') is operated as a current-controlled element in a first range (b1) of the output voltage (OUR) and as a voltage-controlled element in a second range (b2).

Figure 1:
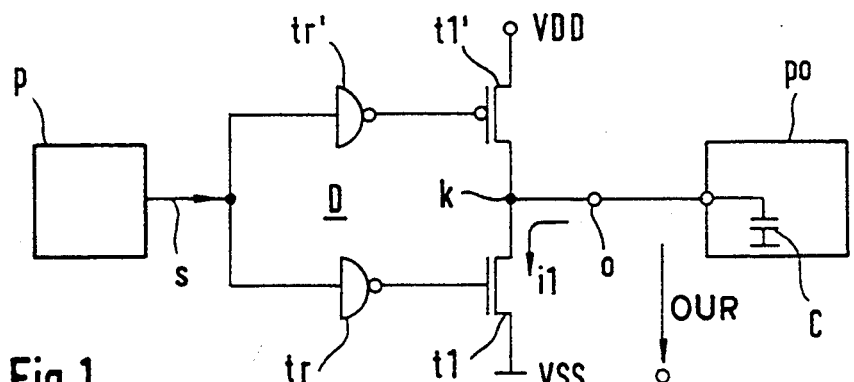
FIG. 1 is a block diagram of a prior art pad-driver circuit for a CMOS output-transistor pair.

FIG. 1 shows the block diagram of a prior art pad driver as is described, for example, in German Patent DE-A-40 27 534. A signal source p delivers a single-phase or antiphase signal s which drives the control electrode of an n-channel output transistor t1 via a lower driver stage tr. Via an upper signal path, the signal s drives an upper driver stage tr' whose output is coupled to the gate terminal of a p-channel output transistor t1'. The lower and upper driver stages are each implemented, for example, with a CMOS inverter, and the complementary output-transistor pair t1', t1 is connected in series between the positive and negative supply voltages VDD, VSS. The node k of the two transistors is coupled to the output terminal o, which is connected to an output pad and/or to internal, on-chip subcircuits. The sum of all signal receivers, po, constitutes for the output terminal o a load capacitance C which must be charged. and discharged in accordance with the signal s. The discharge current through the output transistor t1 is the load current i1.

Figure 2:
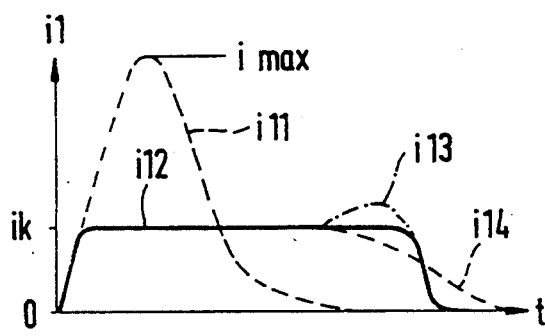
FIG. 2 shows the actual variation and desired variation of the load current with time.

In FIG. 2, the broken line i11 shows the actual output current-time relationship as is obtained, for example, during the discharge of the load capacitance C of FIG. 1. The current i11 first rises quickly to a maximum current i max and finally drops back to the value zero. The pulse-like load current i11 causes an unnecessarily steep switching edge and, via the pulse-like current peak, a voltage dip on the supply lines. For reliable data transfer via the output terminal o, however, it is quite sufficient in accordance with the invention if the load current i1 is limited to the level of a constant current ik far below the maximum current i max, cf. the current curve i12 of FIG. 2.

Figure 3:
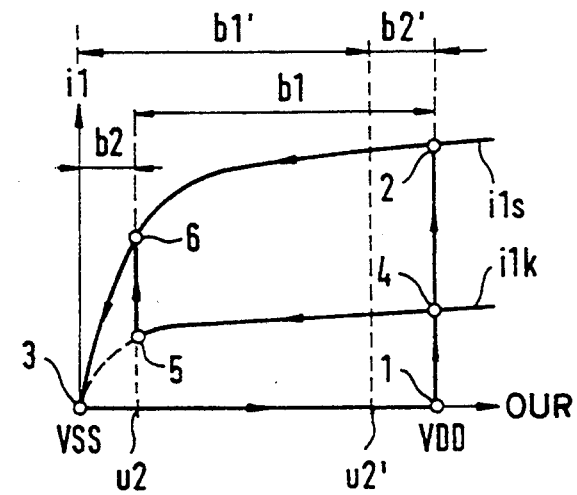
FIG. 3 shows the load current as a function of the output voltage in the prior art and in the method according to the invention.

In FIG. 3, the load current i1 of the circuit arrangement of FIG. 1 is shown as a function of the drain-source voltage of the transistor t1, which is equal to the pad output voltage, OUR. The pulse-shaped load-current curve i11 of FIG. 2 results from the fact that during the discharge of the load capacitance C the individual portions of the current/voltage characteristic are traversed successively, namely according to the point sequence 1, 2, and 3 in FIG. 3. The discharge of the load capacitance C, which is charged to the positive supply voltage VDD, begins at point 1. Via the vertical portion of the characteristic, the discharge current i1 very quickly reaches its maximum value i max (cf. FIG. 2) at point 2, from which the discharge characteristic follows the static output characteristic i1s of the transistor t1, which is valid for the gate-source voltage Vgs=VDD, to point 3. During the actual discharge of the load capacitance C, the maximum value at point 2 is reached only with a short time delay due to the finite switching times of the transistors, cf. FIG. 2. In the dynamic case, therefore, point 2 will move only a little on the current-/voltage curve i1s in the direction of a smaller load-current maximum.

The transistor t1 is not involved in the charging of the load capacitance C, so that between points 3 and 1, the current i11, or i1 has the value zero. At point 1, the cycle is complete, and the discharge process can start anew.

Figure 4:
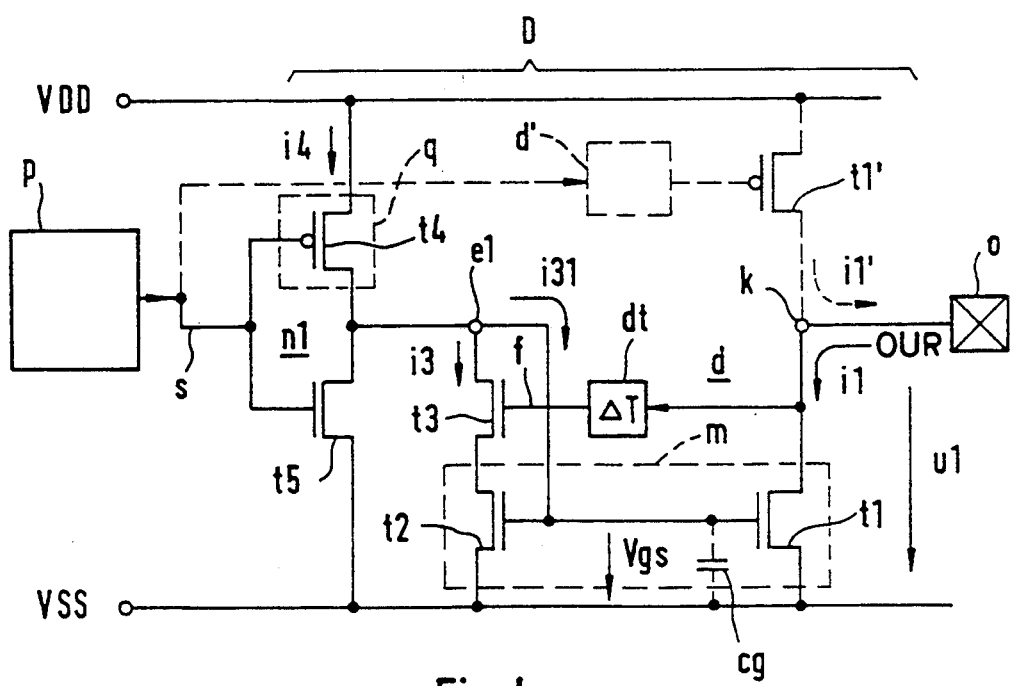
FIG. 4 is a schematic circuit diagram of a particularly simple embodiment of the invention.

FIG. 4 shows a particularly simple embodiment of a pad driver D with which the current-setting method according to the invention can be carried out. As in FIG. 1, a signal source p supplies a signal s to a lower and an upper signal path. The lower signal path contains a pad driver half stage d for driving the lower output transistor t1, and the upper signal path contains a pad driver half stage d' for driving the upper output transistor t1'. In the lower pad driver half stage, the signal s drives a driver stage implemented with a CMOS inverter nl. The associated p-channel transistor 14 is designed to be driven by the signal s into the nonconducting state or a saturated state. In the saturated state, it forms a current source q which is connected to a control input i31 of a current mirror m. This current mirror mirrors the current from the current source q into the output transistor t1, with a fixed transfer ratio increasing the load current i1 in the desired manner.

The current input of the current mirror m is formed by a second transistor t2 whose low end is tied to the negative supply voltage VSS and whose control electrode is connected to the control input e1 together with the control electrode of the output transistor t1. The desired load current i1 of the output transistor t1 is set via the width/length ratio of the two current-mirror transistors t1 and t2 and the current source q.

The current input of the current mirror m is supplied with the output current i4 from the current source q. This is done via a switch arrangement including a third transistor t3, which is an n-channel transistor which is connected between the control input e1 and the current input of the current mirror m. The control electrode of the third transistor t3 is connected via a delay stage dt to the node k and the output terminal o. Thus, the output voltage OUR is applied through the delay stage dt as a feedback signal f delayed by a time T to the control electrode of the third transistor t3.

Figure 5:
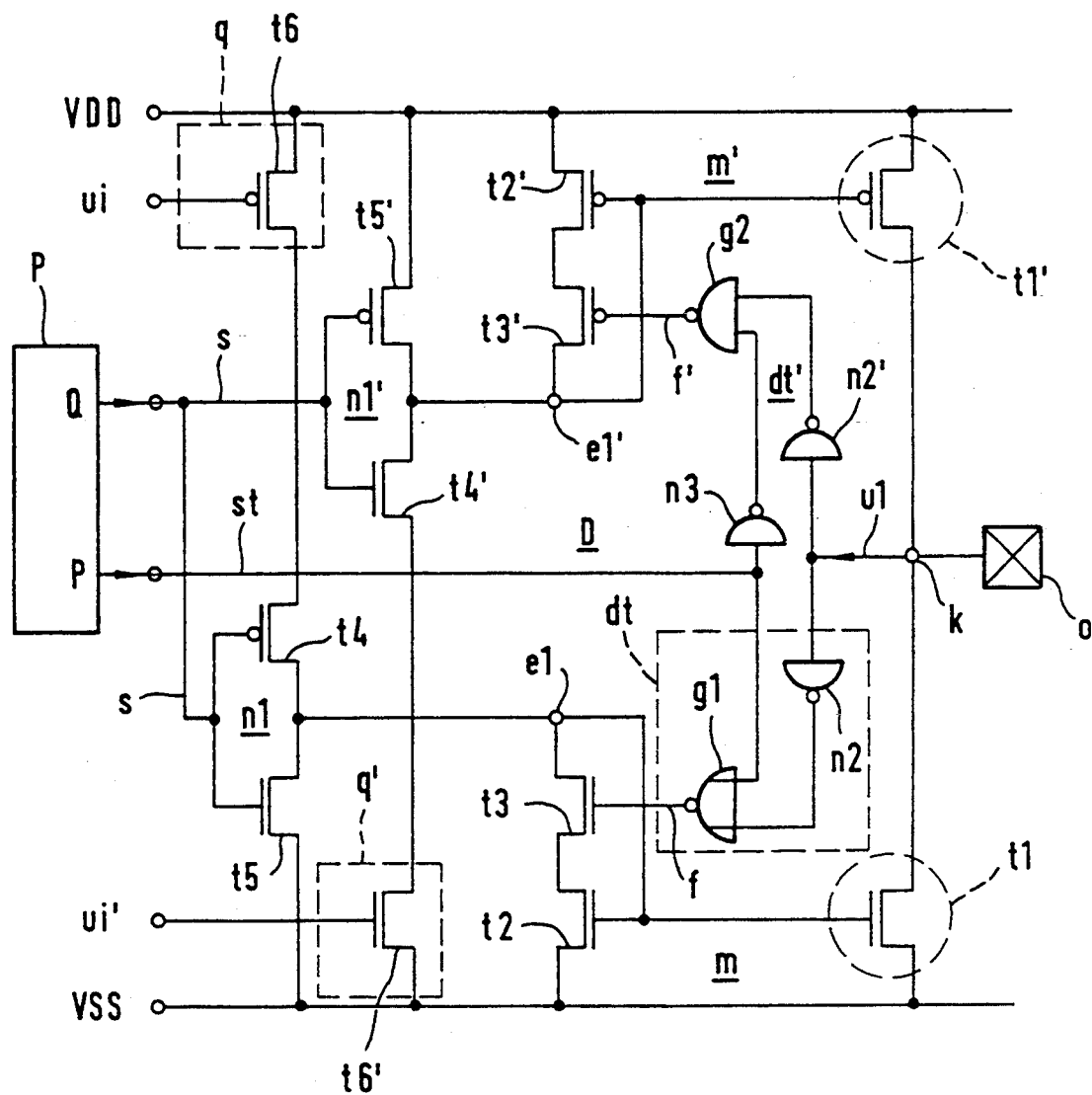
FIG. 5 is a schematic circuit diagram of an embodiment with improved output current setting.

According to the invention, in the circuit of FIG. 4, the third transistor t3 is turned on in the middle range and upper range (first range b1 in FIG. 3) of the output voltage OUR, so that the current i4 from the current source q can flow as current t3 through the third transistor t3 to the current input of the current mirror m, see also FIG. 5. At a low output voltage OUR (second range b2 in FIG. 3), the third transistor t3 is turned off, so that the current i4 cannot reach the current input of the current mirror m, but will flow as current i31 directly to the gate terminal of the output transistor t1. There it merely serves to quickly charge/discharge the gate capacitance of the output transistor t1, shown schematically in FIG. 4 as an equivalent capacitance cg. By contrast, in FIG. 1, the output transistor t1 is driven via the low-impedance driver stage tr, not via a current source.

The family of characteristics shown in FIG. 3 also includes the output characteristics of the transistor t1 of the circuit of FIG. 4. The whole discharge process of the load capacitance C again forms a closed curve, which is described by points 1, 4, 5, 6, 3, and 1 again.

According to the invention, the discharge of the load capacitance C, charged to the positive supply voltage VDD, begins again at point 1. Via the vertical portion of the characteristic, the current-source mode is reached very quickly at point 4, which is far below the maximum value, which is determined by point 2. In accordance with the current-source characteristic of the output transistor t1, which is driven via the current mirror m, the output current i1 of this transistor remains relatively constant and follows a constant-current curve i1k to point 5. In the simple embodiment of FIG. 4, the associated gate-source voltages Vgs of the output transistor t1 for the characteristic i1k is approximately Vgs=VDD/3.

If the current-mirror drive of the output stage were maintained beyond point 5, the output voltage OUR would approximate the final potential at point 3 of the characteristic i1k with a decreasing load current i14 (see FIG. 2).

According to the invention, this drawback of the current-mirror drive is eliminated by the insertion of the switching transistor t3 into the current-mirror input. As soon as the switching transistor t3 can no longer be turned on by the output voltage OUR, which is the case upon attainment of the threshold voltage u2 at point 5, the output current i4 of the current source q no longer flows through the series-connected transistors t3, t2 to the low end of the current mirror m, but charges the gate of the output transistor t1 to the full positive supply voltage VDD as current i31. The gate-source voltage Vgs rapidly increases from the low value, e.g., VDD/3, to VDD. Accordingly, in the family of characteristics of FIG. 3, the load current i1 jumps from point 5 to point 6. This causes a quick residual discharge of the load capacitance C on the current/voltage curve i1s to point 3.

The steplike increase of the load current i1 between points 5 and 6 can be rounded in the dynamic mode of operation by means of suitable circuitry such that a slight increase of current i13 (FIG. 2) or a smooth characteristic i12 (FIG. 2) can be set, as desired. This is achieved in the embodiments of FIGS. 4 and 5 by inserting the delay stage dr. The delayed drive of the transistor t3 shifts the threshold voltage u2 and, thus, point 5 on the characteristic i1k in the direction of point 3. FIG. 3 shows that the step-change value of the load current i1 between points 5 and 6 decreases as point 5 moves closer to point 3.

The first and second voltage ranges b1, b2 in FIG. 3 are defined by the position of the threshold voltage u2, which, for the discharge-current path via the transistor t1, is close to the negative supply voltage VSS. For the charging-current path via the transistor t1', the associated threshold voltage u2' is close to the positive supply voltage VDD. For the charging current through the transistor t1', the current curve of FIG. 3 must be mirror-inverted, with the mirror axis running through the mean supply voltage.

In the dynamic mode, the delay stage dt causes a shift on the threshold voltage u2 of the third transistor t3 in the direction of the negative supply voltage VSS. The peak of the current i1 shown in FIG. 3 at point 6 thus becomes smaller than at the threshold voltage u2 which is actually present. It is also possible, of course, to connect the control terminal of the third transistor t3 directly, without the interposed delay stage dt, to the node k.

In FIG. 4, only the pad driver half stage d for the n-channel output transistor t1 is shown. The upper pad driver half stage d' for the p-channel output transistor t1' is constructed as the mirror image of the lower driver half stage d, with the p- and n-channel transistors interchanged. The symmetrical construction of the complete pad driver D is also apparent from FIG. 5. In addition to the illustrated CMOS technology, the method of setting the output current of monolithic integrated pad drivers can be implemented in other circuit technologies, such as single-channel MOS or bipolar technology.

In the embodiment of FIG. 5, the subcircuits already described in detail in connection with FIG. 4 are designated by like reference characters, so that they are not discussed again. An essential difference lies in the design of the current source q and the subsequent circuit arrangement in the form of a first inverter n1. The first inverter n1 of FIG. 5 is a conventional CMOS inverter comprised of the complementary switching transistors t4, t5. The current source q is a separate subcircuit which is connected in series with the first inverter n1. The first inverter n1 thus has a pure switching function. In the first state, it connects the output of the current source to the control input e1, and in the second state, it prevents the flow of current-source current to the control input e1.

Figure 6:
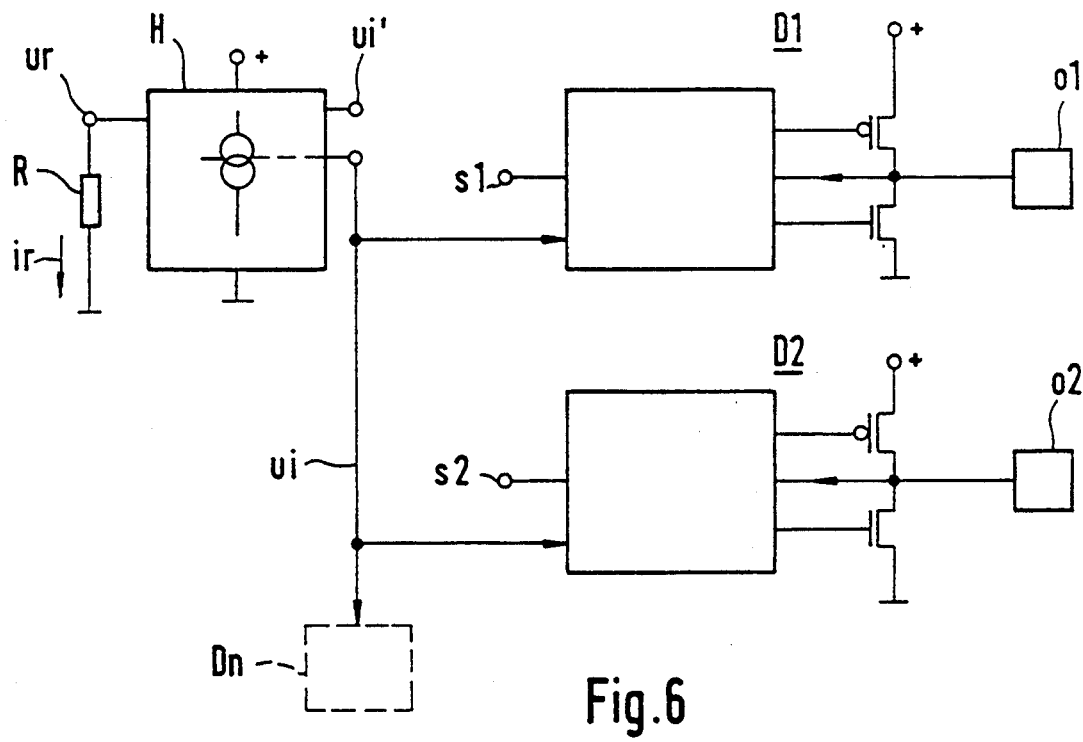
FIG. 6 is a block diagram of an embodiment with a plurality of pad drivers whose output currents are set by a common current-source control voltage.
Figure 7:
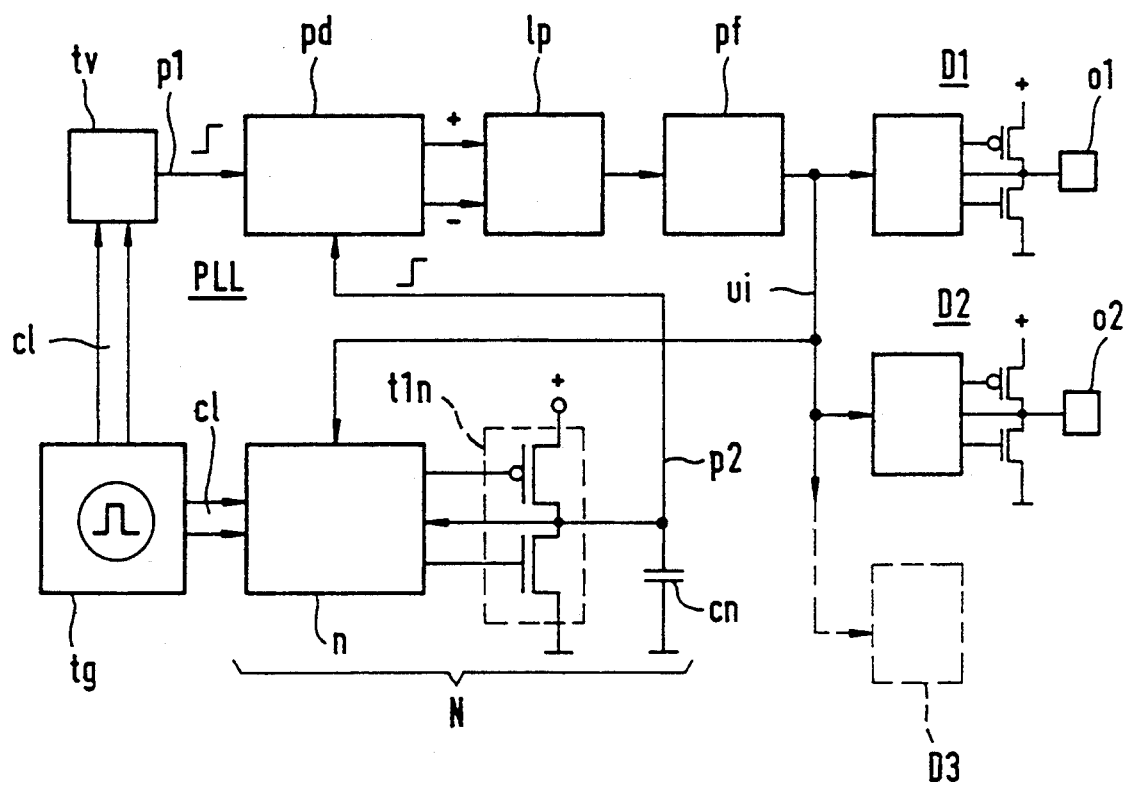
FIG. 7 is a block diagram of a particularly advantageous embodiment in which the current-source control voltage is formed by means of an on-chip PLL circuit with external components.

The current source q is formed by a sixth transistor t6, a p-channel transistor connected between the positive supply voltage and the fourth transistor t4. The control electrode of the sixth transistor t6 is connected to a current-source control voltage ui, which may be, for example, the control voltage of a p-channel current bank or any other current reference. As the current source q is a separate subcircuit, the input current of the current mirror m can be set much more accurately than if the current source is combined with the transistor t4, as in FIG. 4. In addition, a plurality of pad drivers D 1, D2, . . . Dn can be connected to the current-source control voltage ui, so that even the use of a relatively complex, but accurate auxiliary circuit for generating the current-source control voltage ui is warranted. FIGS. 6 and 7 show particularly advantageous embodiments of the generation of the current-source control voltage ui.

In FIG. 5, another difference from FIG. 4 is the design of the delay stage dt. This stage contains an inverter n2 and a NOR gate g1 whose second input is connected to a blocking output P of the signal source p. By a blocking signal st, the transistor t3 in the current input of the current mirror m can be permanently blocked, so that the effect of the output-current setting in accordance with the invention can be tested in operation. In certain circumstances, this is an important tool for analyzing the various interference effects.

The delay stage of the upper pad driver half stage is of complementary construction, since its output signal must block the p-channel transistor t3'. It contains a NAND gate g2 whose first and second inputs are connected via inverters n2' and n3' to the node k and the blocking output P, respectively. The symmetrical design of the circuit arrangement of FIG. 5 between the positive supply voltage VDD and negative supply voltages VSS has been emphasized in the representation by designating subcircuits having similar functions by similar reference characters, with the reference characters of the upper pad driver half stage provided with the additional symbol'.

FIG. 6 shows schematically a plurality of pad drivers D 1, D2, ... Dn, which correspond, for example, to the embodiment of FIG. 5 and to which the output from an auxiliary current source H is applied as current-source control voltage ui. The auxiliary current source determines the level of the current-source control voltage ui, e.g., by means of a controlled current source which generates a loadable reference voltage ur and forms a constant reference current ir by means of a resistor R. If this reference current ir is supplied to the input of a p-channel current mirror having its bottom end connected to the positive supply voltage VDD, the common gate voltage of this current mirror will already provide the desired current-source control voltage ui. If the output voltage of this current mirror is mirrored at the negative supply voltage VSS by means of an n-channel current mirror, the current-source control voltage ui' for the current sources q' of the upper pad driver half stages will be obtained, unless this control voltage is generated internally by mirroring in each of the pad drivers. Since the reference voltage ur can be generated with very high accuracy and temperature stability using integrated circuit technology, the reference current ir can be accurately set via an external resistor R. The only drawbacks are the additional connecting lead and the external component.

FIG. 7 shows an embodiment which makes it possible to generate the current-source control voltage ui by a particularly advantageous method, and which sets the load current with a command reference which is already present in most integrated circuits. The command reference is a standard clock which is generally available on every chip as a system clock signal from a crystal-controlled clock generator. By this method, a current-source control voltage ui of high accuracy is generated. This circuit permits the load current i1 to compensate for technological and environment-dependent parameters. To this end, the controlled current source in the auxiliary current source H is replaced by a phase-locked loop (PLL) which, as a controlled system, evaluates the charging/discharging period of a simulated output load capacitance cn. The charging/discharging of the simulated load capacitance cn is effected by means of a pad-driver-simulating network N which includes an output-transistor-simulating network t1n. To this end, the pad-driver-simulating network N contains a network n simulating a complete driver stage, an output-transistor-simulating network t1n connected to this driver-simulating network n, and the above-mentioned simulated load capacitance cn. The current-determining elements of the simulating networks cn and t1n can be scaled down with regard to the current yield if the current of the current source in the simulating network N is reduced in the same ratio.

The PLL compares in a phase detector pd the time difference between a first edge signal p1 and a second edge signal p2, which are preferably derived from the clock-delay stage tv and from a switching edge at the simulated load capacitance cn, respectively. A time difference of zero represents the reference value or set point for the PLL. From the system clock signal, which is commonly provided by an on-chip crystal-controlled clock generator tg or applied as an external clock signal cl, the first edge signal p1 is derived by delaying the clock signal cl in the clock-delay stage tv by, e.g., exactly one half clock period. At the same time, the clock signal cl is applied to the signal input of the simulating network N, which causes the connected load-capacitance-simulating network cn to be charged/discharged. This charging/discharging time serves as actuating variable in the PLL.

The phase detector pd evaluates the phase differences between the first and second edge signals p1, p2 and applies the positive or negative deviation signal directly to the positive or negative current source of a charge pump lp, whose output is smoothed by a loop filter pf. The output of the loop filter pf is already the desired current-source control voltage ui, which is applied to the current-source control inputs of the pad drivers D1, D2 and the simulating network N.

In this manner, the propagation delay of the simulating network N is controlled by the PLL to be always exactly equal to the fixed propagation delay of the delay stage tv. Via the control voltage ui, however, all existing output stages D1, D2, D3 are controlled as well. If the simulating network N and output stages D1, D2, D3 have the same ratio of current yield to load capacitance, the respective propagation delays are equal. The respective load currents i1 are thus fixed in magnitude.

Changes in signal delay, e.g., due to supply-voltage influences or temperature effects, will immediately be compensated for by the PLL. The same applies to changes resulting from technological variations in the manufacturing process, so that at all times, that load current is made available which permits the desired charging/discharging period of the load capacitance.

In the CMOS fabrication process, the tolerances of the load-capacitance-simulating network cn, which is commonly implemented via the respective gate processes, are generally quite small. Besides, the fabrication process is identical at least with the fabrication process for the signal input stages on the chip. If necessary, the simulated load capacitance cn can be replaced or supplemented by an externally connected capacitance to adapt the pad driver to an originally unknown load capacitance.

A further advantage of the method for setting the output current of one or more pad drivers is that in the quiescent state, the associated circuit is free of shunt current, since the current of the respective current source q is separated from the current-mirror input by the switch arrangement t3. Thus, the shunt-current path is interrupted in the discharged condition. In the charged condition, the current-mirror input must be kept current-less anyhow, so that no shunt current can flow, either. Only during the discharging process, and then only in the first voltage range b1 (FIG. 3), is the shunt current path via the transistor t3, t2 briefly open for the current i4 from the current source q.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. The following claims are, therefore, to be read to include not only the combination of elements which are literally set forth, but all equivalent elements for performing substantially the same function in substantially the same way to obtain substantially the same result. The claims are thus to be understood to include what is specifically illustrated and described above, what is conceptionally equivalent, and also what essentially incorporates the essential idea of the invention.

We claim:

1. An improvement in a method of setting an output current of a pad driver (D: D1, D2, . . . Dn) comprising the steps of:

operating an output transistor as a current-controlled element in a first range of an output voltage (OUR); and subsequently operating said output transistor as a voltage-controlled element in a second range, where said step of operating said output transistor as said current-controlled element in said first range comprises the step of:

driving a control electrode of said output transistor, which is coupled to a control input of said pad driver, in the first range by means of a current mirror (m) whose input is fed from a current source and whose output is formed by the output transistor;

and where subsequently operating said output transistor as a voltage-controlled element in said second range comprises the steps of:

disabling a control electrode of the output transistor in the second range, which output transistor is coupled directly to the control input of said pad driver, and disabling the current-mirror input with respect to the control input of said pad driver.

2. An improvement in a method of setting an output current of a pad driver (D: D1, D2, . . . Dn) comprising the steps of:

operating an output transistor as a current-controlled element in a first range of an output voltage (OUR); and subsequently operating said output transistor as a voltage-controlled element in a second range, wherein said steps of operating comprises the step of changing-over from a current-controlled mode in said first range to a voltage-controlled mode in said second range of the output transistor by operation of a switching circuit using a feedback signal (f) dependent on the output voltage (OUR), an input-current path of a current mirror (m) being electrically disconnected from a control input of said pad driver by said switching circuit in said second range, wherein a control electrode of the output transistor is electrically connected to the control input of said pad driver in said second range, and wherein the first and second ranges are set by a switching threshold of the switching circuit.

3. The method of claim 1 wherein said step of operating comprises the step of changing-over from a current-controlled mode to a voltage-controlled mode of the output transistor by electronic switching in a switching circuit using a feedback signal (f) dependent on the output voltage (OUR), said input current source and said current mirror (m) being separated from the control input, wherein the control electrode of the output transistor is connected to the control input, and wherein the first and second ranges are set by a switching threshold of the switching circuit.

4. The method of claim 2 wherein the step of operating comprises the step of delaying the feedback signal (f) with respect to the output voltage (OUR) by means of a delay stage circuit which provides a delay (T) shorter than the pulse transition time of the output voltage (OUR).

5. The method of claim 3 wherein the step of operating comprises the step of delaying the feedback signal (f) with respect to the output voltage (OUR) by means of a delay stage circuit which provides sa delay (T) shorter than the pulse transition time of the output voltage (OUR).

6. The method of claim 3 wherein the step of electronic switching comprises the steps of:

coupling a current input of the current mirror (m) to a second transistor which is connected to the control input via a switching transistor;

coupling a delay signal from a delay stage circuit to a control electrode of the switching transistor, and coupling signals from the control input on a common control line to the current mirror (m).

7. The method of claim 1 comprising the step of providing at least one saturated field-effect transistor in the current source.

8. The method of claim 2 further comprising the step of:

feeding a current source, having at least one transistor with a control electrode, with a current source control voltage coupled to the control electrode from an auxiliary current-source (H).

9. The method of claim 8 comprising the step of determining a level of the current source control voltage by the auxiliary current source (H) by means of a controlled current source.

10. The method of claim 9 comprising the steps of:

controlling the controlled current source by a phase-locked loop circuit;

coupling to the phase locked loop circuit a signal corresponding to a charging/discharging period of a simulated load capacitance (cn) in a pad-driver-simulating network (N);

coupling to the phase locked loop circuit a reference signal which is a delay of a clock-delay stage (tv) supplied with a standard clock signal; and determining a deviation of the charging/discharging period from a set point by means of a phase detector (PD).

11. An apparatus for setting an output current of a pad driver (D; D1; D2, . . . Dn) with a circuit which operates an output transistor as a current-controlled element in a first range of an output voltage (OUR) provided on a node (k) and as a voltage-controlled element in a second range, said circuit comprising:

an input of the circuit coupled to the node (k);

an output of the circuit coupled to a control electrode of the output transistor;

an electronic switching circuit controlled by the output voltage (OUR);

at least one current source which is coupled to the control electrode of the output transistor via the electronic switching circuit; and a current mirror (m) where in the first range the control electrode of the output transistor, which is coupled to a control input, is driven by said current mirror (m) having an input fed from the current source and wherein the apparatus has an output provided by the output transistor, and in the second range, the control electrode of the output transistor is coupled directly to the control input, and the current-mirror input is disabled with respect to the control input.

12. The apparatus of claim 11 wherein change-over from a current-controlled mode to a voltage-controlled mode of the output transistor (t1;t1') is provided by means of a switching circuit and a feedback signal (f) dependent on the output voltage (OUR), an input-current path of the current mirror (m) being electrically separated from the control input;

the control electrode of the output transistor being connected to the control input; and the first and second ranges being set by a switching threshold of the switching circuit.

13. The apparatus of claim 12 wherein the feedback signal (f) is delayed with respect to the output voltage (OUR) by means of a delay stage circuit which provides a delay (T) shorter than the pulse transition time of the output voltage (OUR).

14. The apparatus of claim 13 wherein the switching circuit comprises:

a current input of the current mirror (m), which is formed by a second transistor, is connected to the control input via a switching transistor;

wherein the control electrode of the switching transistor is supplied with the output from the delay stage circuit; and a common control line of the current mirror (m) is coupled to the control input.

15. The apparatus of claim 11 wherein the current source comprises at least one saturated field-effect transistor.

16. The apparatus of claim 12 further comprising an auxiliary current-source (H) and wherein the current source comprises at least one transistor having a control electrode fed with a current source control voltage from the auxiliary current-source (H).

17. The apparatus of claim 16 wherein the current source is a controlled current source controlled by the auxiliary current source (H) which determines the level of the current source control voltage.

18. The apparatus of claim 17 comprises:

a simulated load capacitance (cn);

a pad-driver-simulating network (N); and wherein the controlled current source comprises:

a phase-locked loop circuit controlled by a charging/discharging period of the simulated load capacitance (cn) in the pad-driver-simulating network (N);

a clock-delay stage circuit for delaying a standard clock signal, tile clock-delay stage circuit for providing a reference signal to the phase locked loop circuit; and a phase detector (PD) for determining the deviation of said charging/discharging period from a set point, the phase detector (PD) having inputs coupled to outputs of the clock-delay stage circuit and the pad-driver-simulating network (N).

* * * * *